United States Patent
Furumochi

(10) Patent No.: US 11,356,595 B2
(45) Date of Patent: *Jun. 7, 2022

(54) IMAGE SENSOR AND IMAGING APPARATUS FOR OUTPUTTING IMAGE DATA BY DISCRIMINATING WHETHER TO ADD A RESULT OF AF CALCULATION TO A CAPTURED IMAGE DATA

(71) Applicant: CANON KABUSHIKI KAISHA, Tokyo (JP)

(72) Inventor: Hiroyuki Furumochi, Musashimurayama (JP)

(73) Assignee: Canon Kabushiki Kaisha, Tokyo (JP)

( * ) Notice: Subject to any disclaimer, the term of this patent is extended or adjusted under 35 U.S.C. 154(b) by 55 days.

This patent is subject to a terminal disclaimer.

(21) Appl. No.: 16/572,376

(22) Filed: Sep. 16, 2019

(65) Prior Publication Data

US 2020/0014840 A1    Jan. 9, 2020

Related U.S. Application Data

(63) Continuation of application No. 15/709,210, filed on Sep. 19, 2017, now Pat. No. 10,447,915.

(30) Foreign Application Priority Data

Sep. 27, 2016    (JP) .................................. 2016-188328

(51) Int. Cl.
H04N 5/232      (2006.01)
H04N 5/378      (2011.01)
H01L 27/146     (2006.01)

(52) U.S. Cl.
CPC . *H04N 5/232122* (2018.08); *H01L 27/14634* (2013.01); *H04N 5/378* (2013.01)

(58) Field of Classification Search
CPC ............... H04N 5/23212; H04N 5/378; H04N 5/232122; H04N 5/232123; H04N 1/32128; H04N 1/32144; H04N 1/32149; H01L 27/14634
See application file for complete search history.

(56) References Cited

U.S. PATENT DOCUMENTS 10,447,915  B2 *  10/2019  Furumochi ........ H04N 5/23212
2015/0035855 A1 *  2/2015  Kim ....................... G06T 5/007
                                                                345/619
2015/0055011 A1 *  2/2015  Aoki ................... H04N 5/23212
                                                                348/353

FOREIGN PATENT DOCUMENTS

| JP | 2014-175739 A  | 9/2014 |
| JP | 2015-152749 A  | 8/2015 |
| JP | 2016-009043 A  | 1/2016 |
| WO | 2016/013410 A1 | 1/2016 |

* cited by examiner

*Primary Examiner* — Nicholas G Giles
(74) *Attorney, Agent, or Firm* — Canon U.S.A., Inc. IP Division

(57) ABSTRACT

An image sensor outputs captured image data by discriminating whether to add a result of an imaging plane phase difference AF calculation to a top of the captured image data or whether to add the result to an end of the captured image data, thus reducing a time lag between exposure and focus position movement.

28 Claims, 14 Drawing Sheets

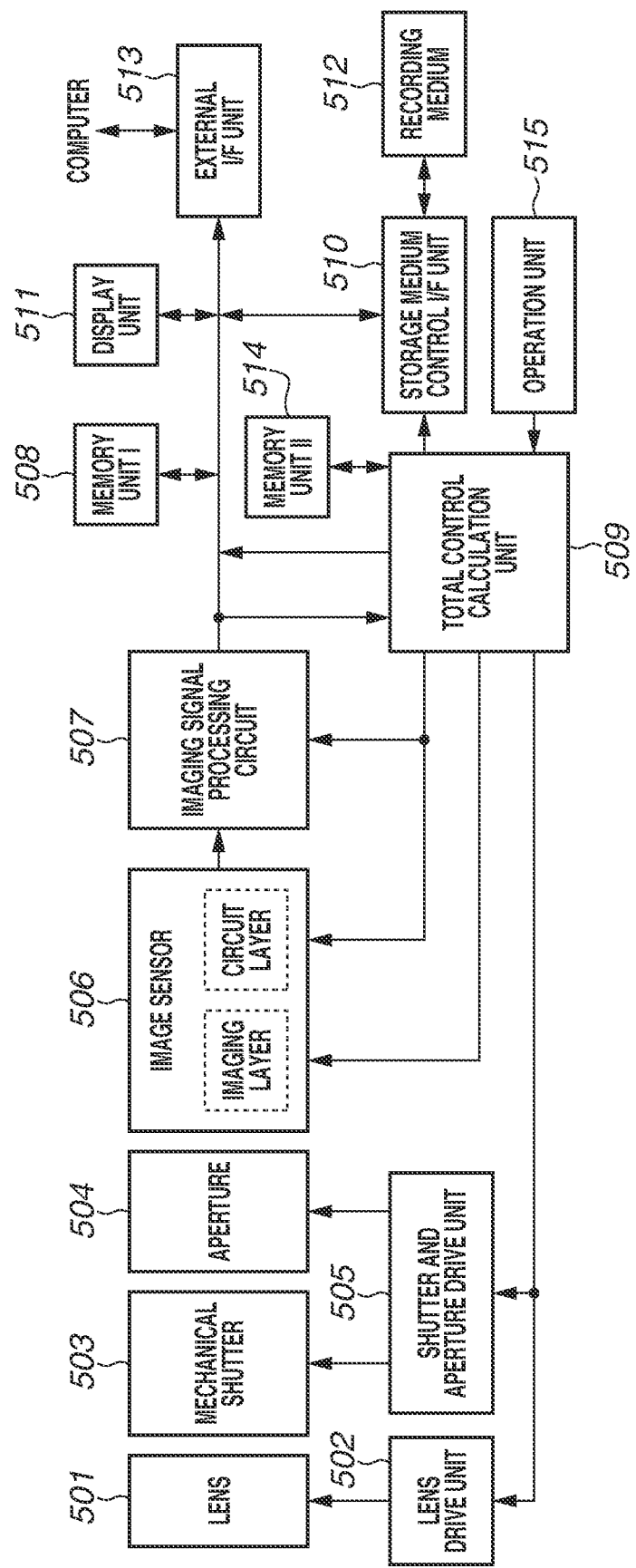

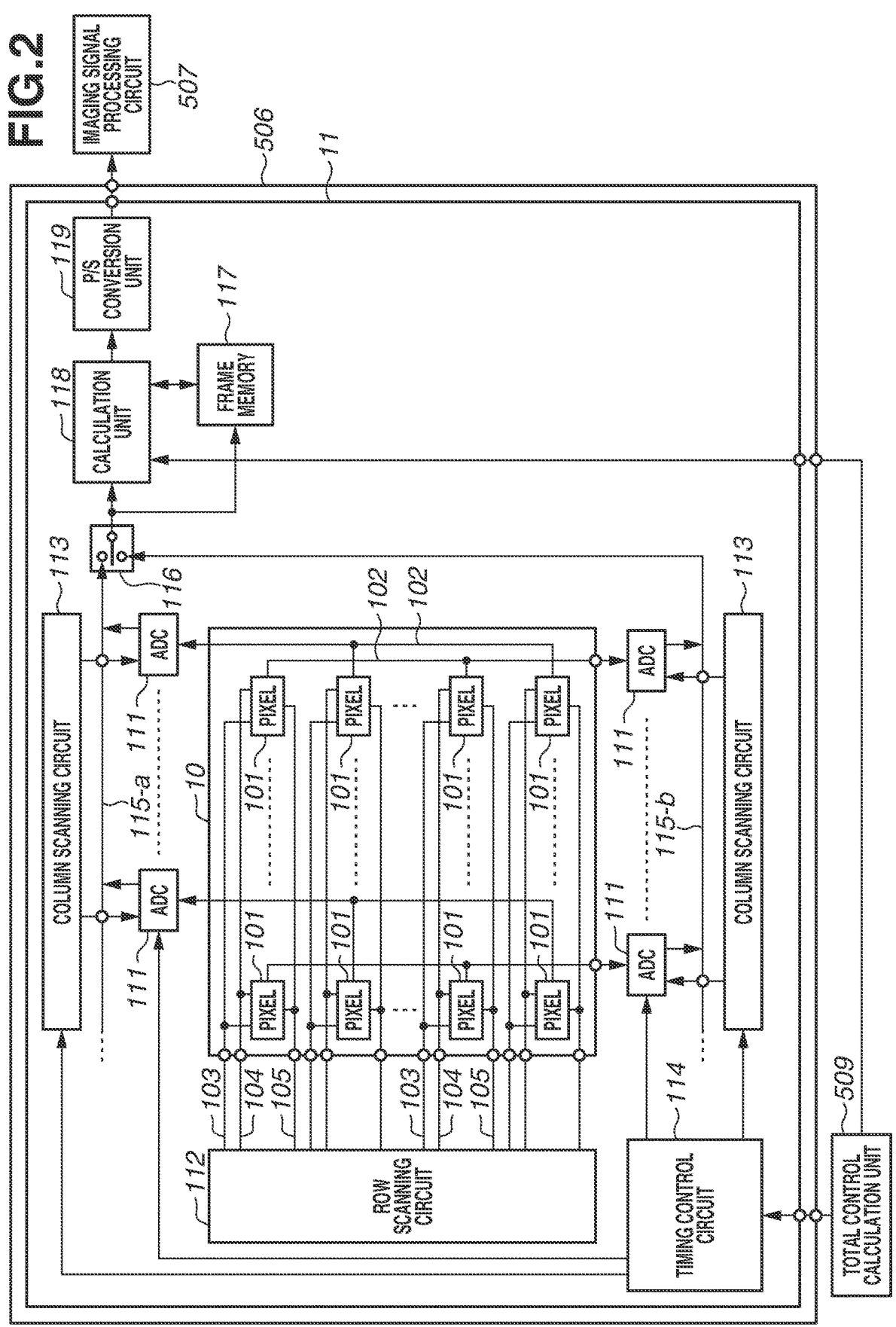

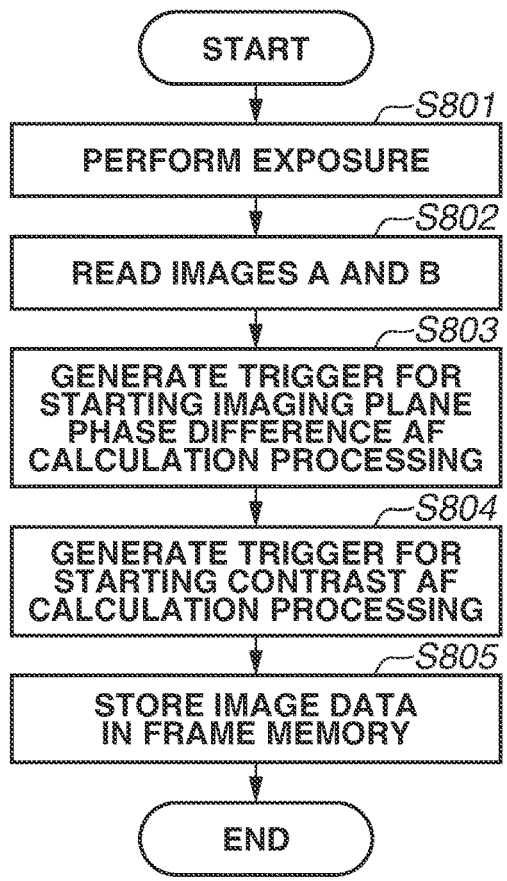
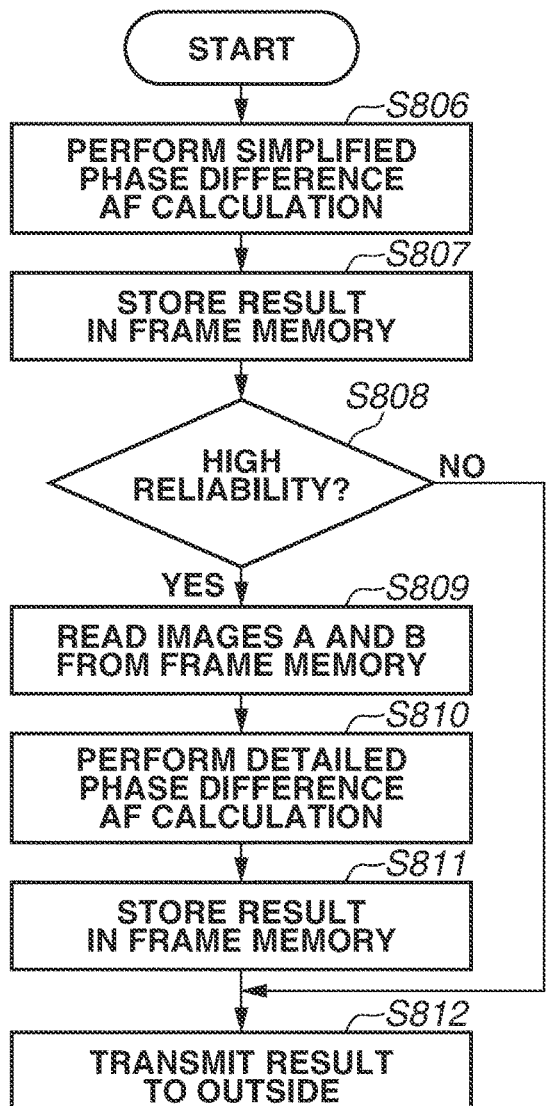
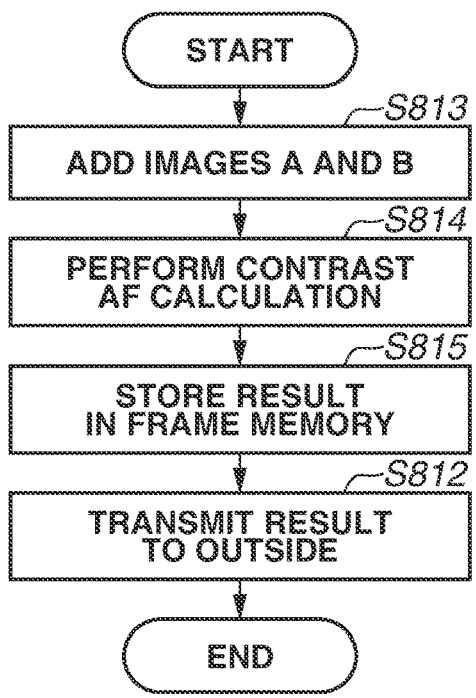

FIG.10

| RESULT OF DETAILED PHASE DIFFERENCE AF CALCULATION |
|---|
| R G / G B  CAPTURED IMAGE INFORMATION |
| RESULT OF SIMPLIFIED PHASE DIFFERENCE AF CALCULATION |
| RESULT OF CONTRAST AF CALCULATION |

FIG.12
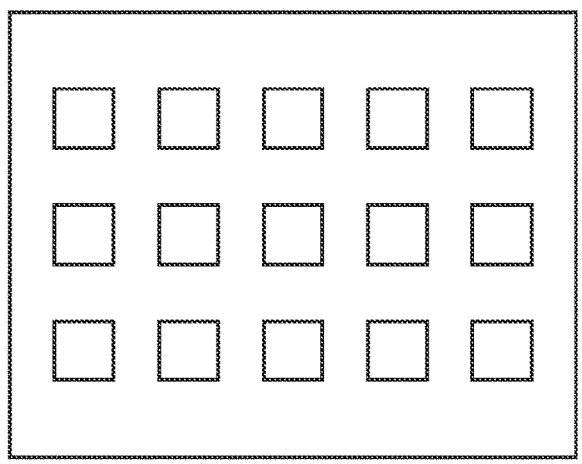
FRAME FOR SIMPLIFIED PHASE
DIFFERENCE AF CALCULATION
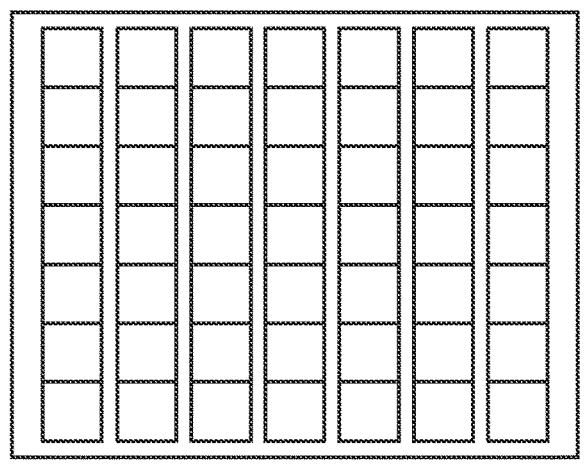
FRAME FOR DETAILED PHASE
DIFFERENCE AF CALCULATION

FIG.14

| RESULT OF SIMPLIFIED PHASE DIFFERENCE AF CALCULATION |
|---|
| RESULT OF CONTRAST AF CALCULATION |
| R G / G B    CAPTURED IMAGE INFORMATION |
| RESULT OF DETAILED PHASE DIFFERENCE AF CALCULATION |

IMAGE SENSOR AND IMAGING APPARATUS FOR OUTPUTTING IMAGE DATA BY DISCRIMINATING WHETHER TO ADD A RESULT OF AF CALCULATION TO A CAPTURED IMAGE DATA

CROSS-REFERENCE TO RELATED APPLICATION

This application is a Continuation of U.S. application Ser. No. 15/709,210, filed Sep. 19, 2017, which claims priority from Japanese Patent Application No. 2016-188328, filed Sep. 27, 2016, which are hereby incorporated by reference herein in their entireties.

BACKGROUND OF THE INVENTION

Field of the Invention

The aspect of the embodiments relates to an image sensor and an imaging apparatus.

Description of the Related Art

In recent years, imaging apparatuses such as digital cameras and smart phones have become popular. These imaging apparatuses are provided with an automatic focus (AF) function of being automatically focused on a subject (adjusting a lens focus position), allowing a user to capture an image of the subject without performing focus adjustment.

Some models of such digital cameras and smart phones employ an imaging plane phase difference AF method in which a phase difference AF method is performed based on output data of pupil-divided phase difference pixels provided on the imaging plane of an image sensor for capturing a subject.

The phase difference AF method refers to an AF method based on the idea that, when a subject is in focus, the positions of two images with different image forming positions are fixed. More specifically, since the distance between the two images is fixed when the subject is in focus, the phase difference AF method calculates the defocus amount indicating how much the lens focus position is deviated from the current lens position based on phase difference information indicating the distance between the two images. Then, the method moves the focus lens to the lens focus position based on the calculated defocus amount, thus achieving focusing.

The above-described phase difference AF method enables obtaining the defocus amount from image data of one frame, remarkably reducing the time required to be focused on the subject and hence achieving high-speed focusing. Japanese Patent Application Laid-Open No. 2016-9043 discusses an image sensor mounting a function of performing correlation calculation based on an imaging plane phase difference AF method.

However, if the number of phase difference pixels used for the imaging plane phase difference AF method is increased intending to improve the AF calculation accuracy and reliability, the time required to calculate the defocus amount will be prolonged.

SUMMARY OF THE INVENTION

The aspect of the embodiments is directed to offering an image sensor capable of shortening a time lag between exposure and focus control while ensuring the operation accuracy and reliability of a phase difference AF calculation even if the calculation time is prolonged with increasing number of phase difference pixels, and an imaging apparatus using the image sensor.

According to an aspect of the disclosure, an image sensor according to an exemplary embodiment of the disclosure includes a pixel unit in which a plurality of unit pixels for converting an optically formed subject image into an image signal is arranged in a matrix form, a first focus detector that performs focus detection by using a first focus detection method based on the image signal to generate first focus detection data, a second focus detector that performs focus detection by using a second focus detection method based on the image signal to generate second focus detection data, and an output unit that adds the first and the second focus detection data to a top of and an end of captured image data based on the image signal, and output the captured image data.

Further features of the disclosure will become apparent from the following description of exemplary embodiments with reference to the attached drawings.

BRIEF DESCRIPTION OF THE DRAWINGS

FIG. 1 schematically illustrates an imaging system according to exemplary embodiments.

FIG. 2 schematically illustrates a structure of an image sensor according to the exemplary embodiments.

FIGS. 8A to 8C are flowcharts illustrating processing according to the exemplary embodiments.

FIG. 10 illustrates a readout image of image information according to the first exemplary embodiment.

FIG. 12 illustrates automatic focus (AF) frames according to the exemplary embodiments.

FIG. 14 illustrates a readout image of image information according to the second exemplary embodiment.

DESCRIPTION OF THE EMBODIMENTS

Figure 3A:
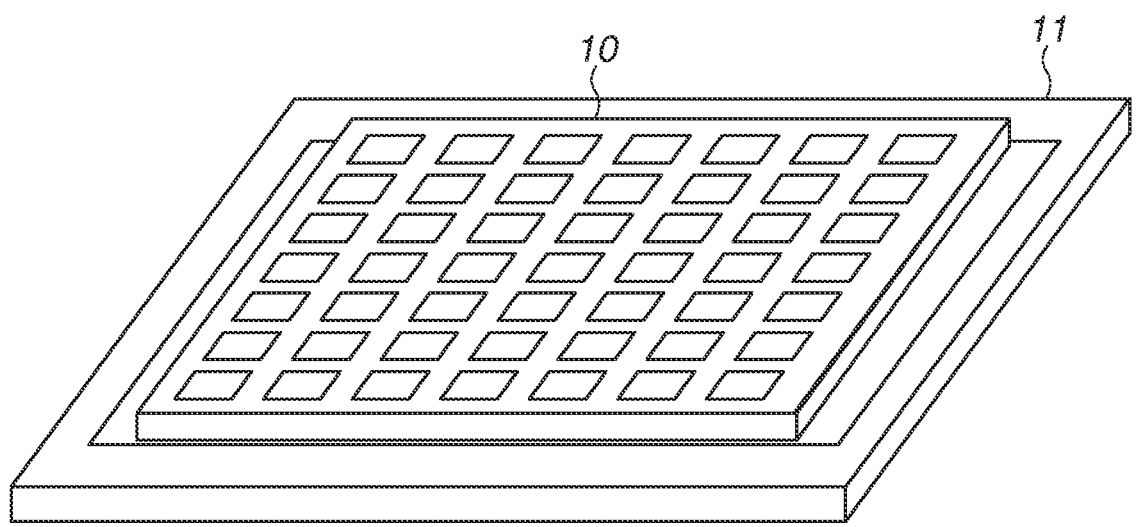
FIGS. 3A and 3B illustrate external forms of the image sensor according to the exemplary embodiments.

FIG. 1 schematically illustrates an imaging system for configuring an imaging apparatus according to a first exemplary embodiment of the disclosure.

Referring to FIG. 1, a total control calculation unit 509 controls the entire imaging system and performs various types of calculation processing. A lens drive unit 502 controls the drive of a lens unit 501 for zooming and focusing. A mechanical shutter and diaphragm drive unit (shutter and diaphragm drive unit) 505 control the drive of a mechanical shutter 503 and a diaphragm 504.

A subject image that has passed through the lens unit 501 is adjusted for a suitable light amount by the diaphragm 504 and then optically formed on the imaging plane of an image sensor 506. The configuration of the image sensor 506 will be described in detail below. The subject image formed on the imaging plane of the image sensor 506 is converted into an image signal. After the analog image signal is applied with gain adjustment, the image signal is converted into a digital signal through analog-to-digital (A/D) conversion. The image sensor 506 outputs the digital image signal of red (R), green in red row (Gr), green in blue row (Gb), and blue (B) to an imaging signal processing circuit 507.

The imaging signal processing circuit 507 perform various types of imaging signal processing (including low pass filter processing for noise reduction, shading correction processing, and white balance (WB) processing), various types of correction processing, and image signal compression processing on the received digital image signal of each color.

A memory unit 508 temporarily stores the image signals. A recording medium 512 is a detachably attached storage medium including a semiconductor memory. A recording medium control interface unit (recording medium control I/F unit) 510 records image data in the recording medium 512 and reads image data recorded in the recording medium 512. A display unit 511 displays image data.

An external interface unit (external I/F unit) 513 is an interface for performing communication with an external computer. The memory unit 14 stores a result of calculation by the total control calculation unit 509. Information about drive conditions of the imaging system set by the user via the operation unit 515 is sent to the total control calculation unit 509. The entire imaging system is controlled based on these pieces of information.

FIG. 2 is a block diagram schematically illustrating an image sensor according to the first exemplary embodiment. The image sensor 506 is controlled by the total control calculation unit 509 illustrated in FIG. 1. Referring to FIG. 2, the image sensor 506 includes a first semiconductor chip (imaging layer) 10 and a second semiconductor chip (circuit layer) 11 which are stacked in layers on top of each other. A plurality of unit pixels 101 arranged in a matrix form is formed on the first semiconductor chip 10. The first semiconductor chip 10 is disposed on the light incidence side, i.e., on the light reception side of an optical image.

In the first semiconductor chip 10, a plurality of the unit pixels 101 arranged in a matrix form in a pixel unit is connected with the same transmission signal line 103, the same reset signal line 104, and the same row selection signal line 105 on a row basis. A plurality of the unit pixels 101 is connected with different vertical output lines 102 in readout row units on a column basis.

A column ADC block 111, a row scanning circuit 112, a column scanning circuit 113, a pixel drive circuit such as a timing control circuit 114, a frame memory 117, a calculation unit 118, a parallel-to-serial conversion unit (P/S conversion unit) 119, etc. are formed in a second semiconductor chip 11.

Different manufacturing processes can be used for the imaging layer and the circuit layer of the image sensor 506 by forming a plurality of the unit pixels 101 in the first semiconductor chip 10 and forming a pixel drive circuit, a memory circuit, a calculation circuit, etc. in the second semiconductor chip 11 in this way. The increase in thinness and density of circuit layer wiring makes it possible to increase the speed, decrease the size, and improve the functionality.

In the second semiconductor chip 11, a switch 116 sequentially and selectively inputs image signals output to horizontal signal lines 115-*a* and 115-*b* for each channel, to the frame memory 117. The frame memory 117 temporarily stores image signals input by the switch 116. The calculation unit 118 performs various types of calculation processing and AF calculation processing (described below) on the image signals stored in the frame memory 117. Results of the AF calculations are temporarily stored in the frame memory 117 as required.

AF methods using image signals output from an image sensor include a contrast AF method and an imaging plane phase difference AF method. The contrast AF method is based on the idea that the contrast value is high when an image is in focus. More specifically, the contrast AF method successively analyzes contrast information of image data obtained from an image sensor while moving the focus lens, and focusing the image at a lens focus position at which the contrast is high based on the tendency of change in subject's contrast (intensity difference).

Since the change in luminance of image data while moving the focus lens is analyzed, the contrast AF method has a disadvantage that focus detection takes time compared with the phase difference AF method.

The imaging plane phase difference AF method makes it possible to detect the defocus amount by detecting, through correlation calculation, the amount of relative image deviation between two pupil-divided images read from pupil-divided pixels for phase difference detection provided in the image sensor. To perform such imaging plane phase difference AF, pixels for phase difference detection in the image sensor is provided, as described above. Each of the contrast AF and the imaging plane phase difference AF methods has advantages and disadvantages. The imaging system according to the present exemplary embodiment is provided with factors of both methods, i.e., "hybrid automatic focus" which combines the contrast AF and the imaging plane phase difference AF methods.

Image information and AF calculation results processed by the calculation unit 118 and stored in the frame memory 117 are applied with parallel-to-serial conversion performed by the P/S conversion unit 119 at a timing controlled by the timing control circuit 114. Then, the result of the conversion is output to the imaging signal processing circuit 507 provided out of the image sensor 506.

Figure 3B:
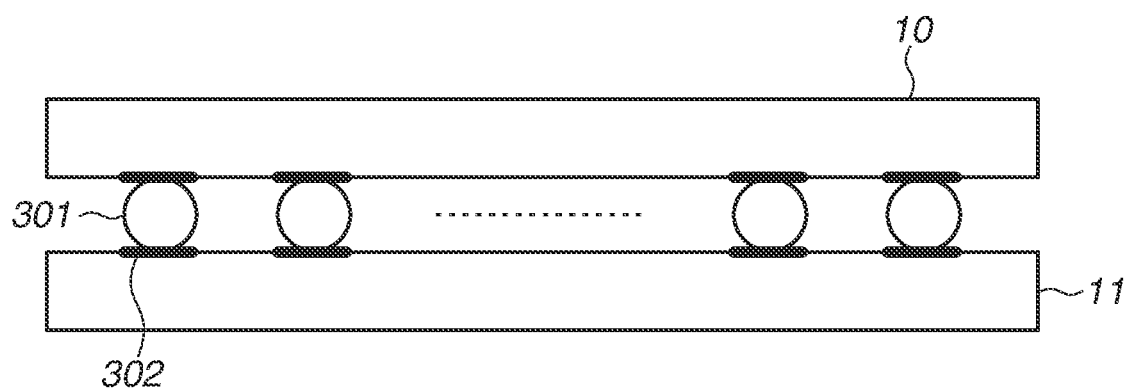

FIG. 3 illustrates an external form of the image sensor 506 illustrated in FIG. 1. FIG. 3A is a perspective view illustrating the image sensor 506 when viewed from obliquely above the light incidence side. FIG. 3B is a sectional view illustrating the image sensor 506. The image sensor 506 includes the first semiconductor chip 10 and the second semiconductor chip 11 illustrated in FIG. 2. The first semiconductor chip 10 and the second semiconductor chip 11 are stacked in layers on top of each other. A plurality of micro pads 302 provided in each chip is integrally formed by being electrically connected via a plurality of micro vamps 301.

Figure 4:
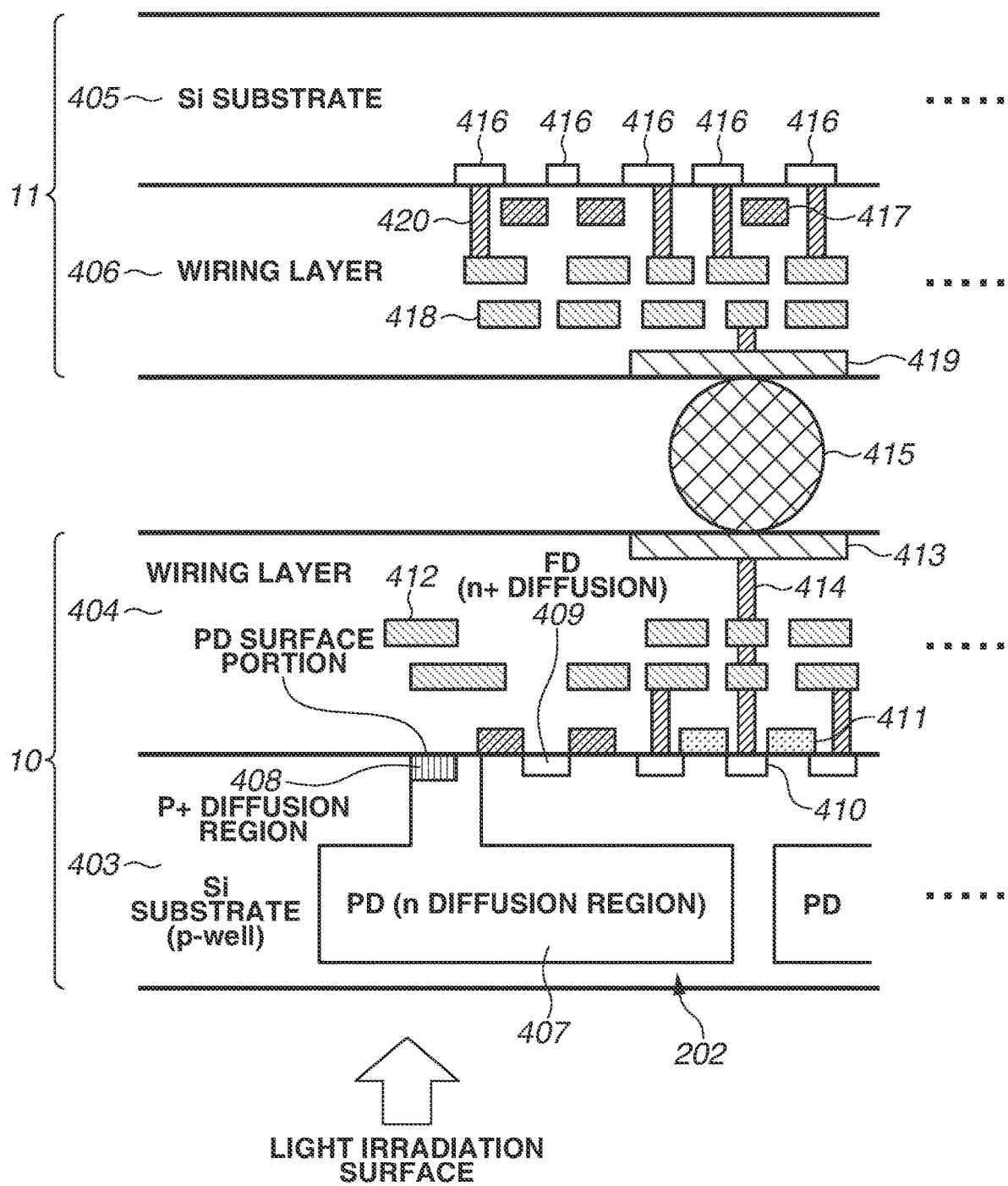
FIG. 4 is a sectional view illustrating the image sensor according to the exemplary embodiments.

FIG. 4 is a sectional view illustrating a detailed structure of the image sensor 506.

In the first semiconductor chip (imaging layer) 10, a wiring layer 404 is formed on a Si substrate 403. An n type diffusion region 407 as a photodiode (PD) 202 is formed in the Si substrate 403, and a p+ diffusion region 408 is formed on the surface portion of the PD 202 (boundary portion between the n type diffusion region 407 and the wiring layer 404). A plurality of n+ diffusion regions 409 as floating diffusion (FD) regions and a plurality of n+ diffusion regions 410 as switching transistors are formed on the surface portion of the Si substrate 403.

In the wiring layer 404, transistor gate wirings 411 and signal propagation wirings 412 are formed in the insulating layer made of SiO2. A micro pad 413 made of Cu is formed on the surface portion of the wiring layer 404. A transmission transistor 202, a reset transistor 203, an amplification transistor 204, and a selection transistor 205 are formed of the n+ diffusion regions 409 and 410 and the transistor gate wirings 411. A VIA 414 for connecting the n+ diffusion regions 410 with the micro pad 413 is formed.

In the second semiconductor chip (circuit layer) 11, a wiring layer 406 is formed on a Si substrate 405. A plurality of transistor diffusion regions 416 is formed on the surface portion of the Si substrate 405.

In the wiring layer 406, transistor gate wirings 417 and signal propagation wirings 418 are formed in the insulating layer made of SiO2. A micro pad 419 made of Cu is formed on the surface portion of the wiring layer 406. Various circuits are formed of the transistor diffusion regions 416, the transistor gate wirings 417, and the signal propagation wirings 418. Details of a circuit section are not the essence of the disclosure, descriptions thereof will be omitted. VIAs 420 for connecting the diffusion regions 416 with the micro pad 419 are formed.

Although, as illustrated in FIG. 4, the first semiconductor chip (imaging layer) 10 and the second semiconductor chip (circuit layer) 11 are connected by using a micro vamp 415 as a stacked layer connection terminal, the first and the second semiconductor chips 10 and 11 can also be directly connected without using the micro vamp 415.

Figure 5:
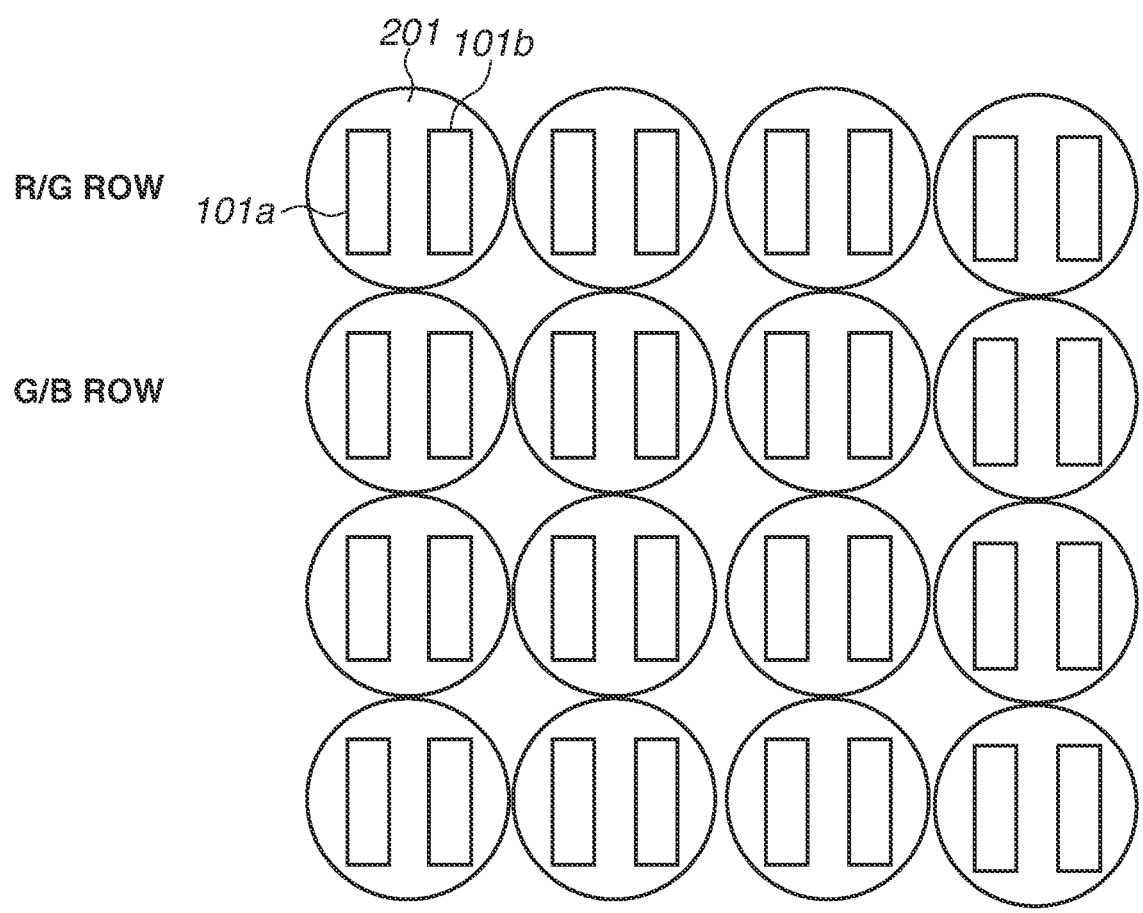
FIG. 5 illustrates a pixel array in the image sensor according to the exemplary embodiments.

FIG. 5 schematically illustrates a pixel array in the image sensor 506 according to the first exemplary embodiment. A Bayer array is applied to the array of color filters provided in each unit pixel. Pixels of an odd number row are provided with RED and GREEN color filters alternately arranged from left to right. Pixels of an even number row are provided with GREEN and BLUE color filters alternately arranged from left to right.

For each pixel, an on-chip micro lens 201 is formed on the color filters. A plurality of rectangles arranged inside the on-chip micro lens 201 indicates a pupil-divided A pixel 101a and a pupil-divided B pixel 101b. The defocus amount of a predetermined region can be detected by detecting the amount of relative image deviation between the A pixel image read from the A pixel 101a and the B pixel image read from the B pixel 101b through correlation calculation. The A and B pixel images can be used as display and recording images by performing addition processing on an A pixel image signal and a B pixel image signal.

Figure 6:
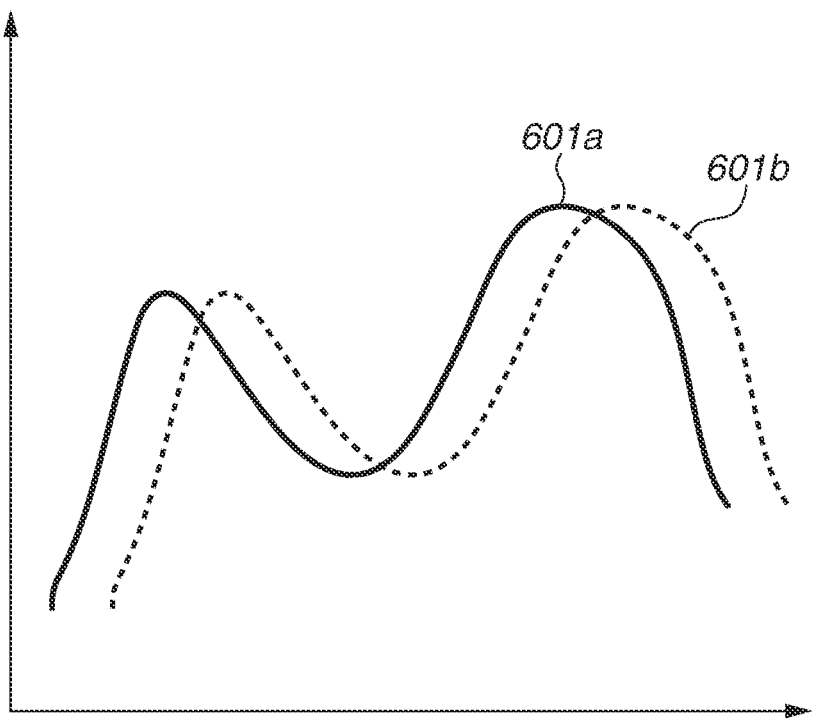
FIG. 6 illustrates signals for focus detection according to the exemplary embodiments.

FIG. 6 illustrates signals for focus detection including an A pixel image signal (A image signal) 601a formed of the image A, which is an image for focus detection and a B pixel image signal (B image signal) 601b formed of the image B, which is an image for focus detection. These signals for focus detection are transmitted to the calculation unit 118 according to the first exemplary embodiment. Referring to FIG. 6, the horizontal axis indicates the direction in which connected signal pixels are arranged, and the vertical axis indicates the signal intensity.

Referring to FIG. 6, since the lens 501 is defocused to the image sensor 506, the A image signal 601a is shifted to the left, and the B image signal 601b is shifted to the right. The defocus amount which indicates how much the lens 501 is defocused can be detected by performing correlation calculation in which the amount of deviation (phase difference) between the images A and B is calculated by the calculation unit 118. The amount indicating the degree of matching between the images A and B can be represented by a formula (1).

$$U = \sum_{j=0} \{(a_j - b_j)\} \quad (1)$$

a denotes the signal intensity level of the A image signal, and b denotes the signal intensity level of the B image signal. The value of the formula (1) decreases with increasing matching between the two images, and is minimized when the two images are in focus. Further, the calculation unit 118 calculates a value U after the image A is relatively shifted with respect to the image B by p pixels, and recognizes the result as a value P.

$$P = \sum_{j=0} \{(a_{j+p} - b_j)\} \quad (2)$$

The value P is minimized with the shift amount at which the two images are in focus. The calculation unit 118 calculates the defocus amount which indicates how much the lens 501 is deviated from the lens focus position, based on the shift amount. When the defocus amount becomes 0 (in-focus state), the images A and B completely coincide with each other. When there is a difference between the images A and B, the accuracy of the imaging plane phase difference AF will decrease.

Accordingly, the calculation unit 118 obtains the area of a common region between the two images as a correlation value and determines the reliability according to the obtained correlation value. When the correlation value is large, the calculation unit 118 determines that the reliability is high. When the correlation value is small, the calculation unit 118 determines that the reliability is low. More specifically, the calculation unit 118 calculates the imaging plane phase difference AF calculation and, at the same time, determines the reliability of the result of the imaging plane phase difference AF calculation.

The calculation unit 118 also performs the contrast AF calculation. As described above, the contrast AF method is a method for determining that the position where the contrast of the subject (intensity difference) is large is the lens focus position. Then, the calculation unit 118 detects the contrast for addition image information obtained by performing addition processing on the A and B pixel image signals.

In a contrast detection method, a high pass filter is applied so that the numerical value increases with increasing luminance change between pixels with respect to the image information for each of a plurality of division blocks of the captured image. The contrast value of each block can be calculated by integrating the signal value calculated by using the high pass filter and then obtaining the sum (SAD value) of the absolute values of differences in luminance value between pixels. Other known methods may be used as the contrast detection method.

Figure 7:
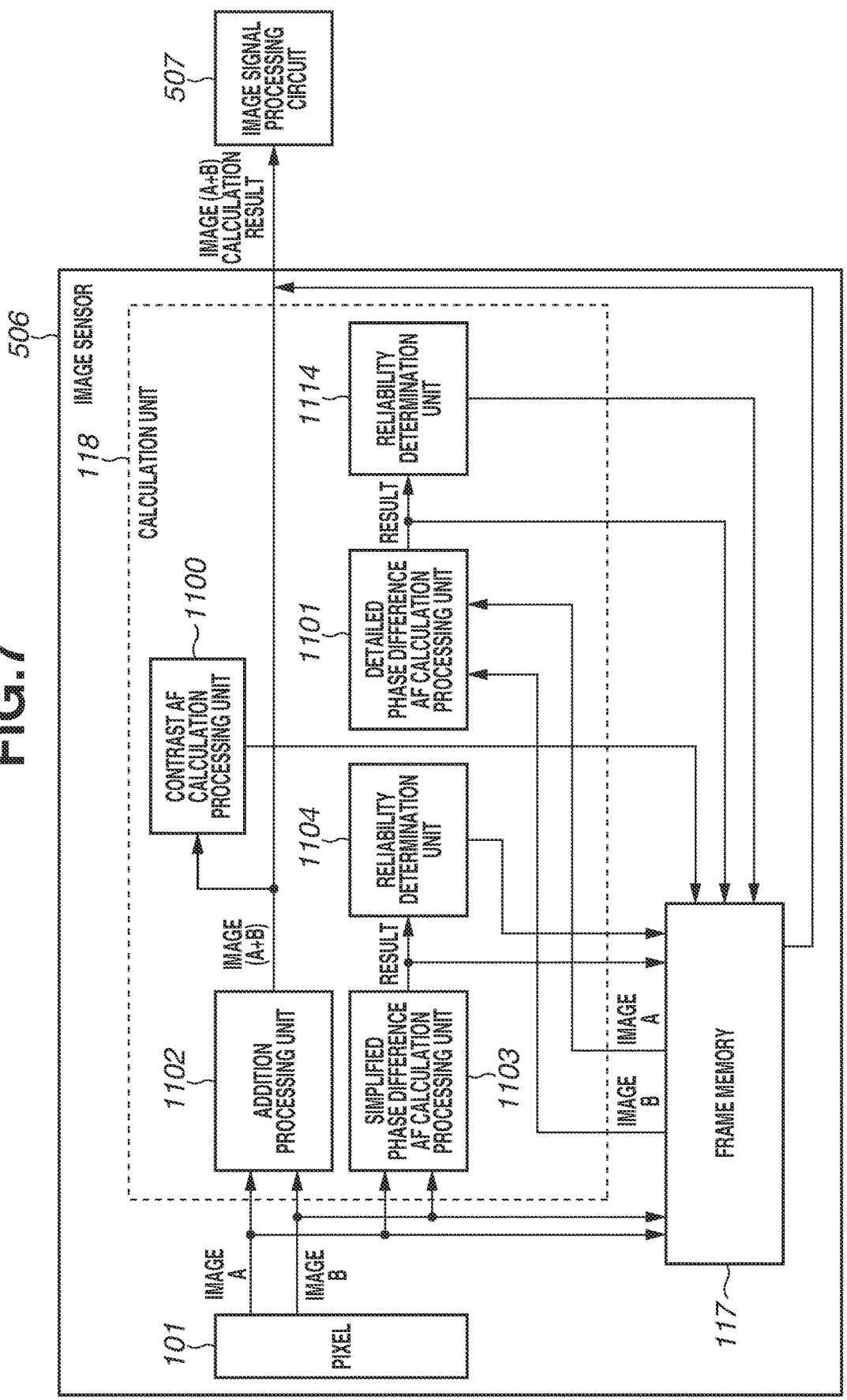
FIG. 7 is a schematic view illustrating the image sensor according to the exemplary embodiments.

FIG. 7 schematically illustrates the configuration of only the unit pixel 101, the calculation unit 118, and the frame memory 117 in the image sensor 506 illustrated in FIG. 2, and the imaging signal processing circuit 507.

In the calculation unit 118, an addition processing unit 1102 performs addition processing on the A and B image signals output from each unit pixel 101 to generate an (A+B) image signal. A contrast AF calculation processing unit 1100 performs the contrast AF calculation processing as a third focus detection method by using the (A+B) image signal and stores the result in the frame memory 117.

In parallel, a simplified phase difference AF calculation processing unit 1103 performs the simplified phase difference AF calculation processing as a first focus detection method. A reliability determining unit 1104 determines the reliability of the result of the simplified phase difference AF calculation (first focus detection data). Then, the reliability determining unit 1104 stores the result of the simplified phase difference AF calculation and the result of the reliability determination in the frame memory 117. The contrast AF calculation processing unit 1100 stores the (A+B) image signal as image information of the unit pixel 101 in the frame memory 117.

When the reliability determining unit 1104 determines that the reliability of the result of the simplified phase difference AF calculation is low, a detailed phase difference AF calculation processing unit 1101 reads the A and B image signals from the frame memory 117. Then, the detailed phase difference AF calculation processing unit 1101 performs detailed phase difference AF calculation processing as a second focus detection method. The reliability determining unit 1114 determines the reliability of the result of the detailed phase difference AF calculation (second focus detection data). Then, the reliability determining unit 1114 stores the result of the detailed phase difference AF calculation and the result of the reliability determination in the frame memory 117. Then, the results of the AF calculations stored in the frame memory 117 are output out of the calculation unit 118.

Upon reception of an instruction for performing the imaging plane phase difference AF calculation on all pixels from the total control calculation unit 509, the calculation unit 118 does not perform the reliability determination on the result of the simplified phase difference AF calculation and the detailed phase difference AF calculation but performs the phase difference AF calculation on all the pixels. Then, the calculation unit 118 adds the result of the phase difference AF calculation to the end of the image information of the following frame, and outputs the image information. Performing control in this way enables improving the accuracy and reliability of the imaging plane phase difference AF calculation although the time lag from exposure is not shortened. This control further makes it possible to determine whether the imaging plane phase difference AF calculation is to be performed on all pixels, by transferring the reliability of the result of the detailed phase difference AF calculation by the reliability determining unit 1114 to the imaging signal processing circuit 507.

FIG. 8A is a flowchart illustrating processing for generating a captured image according to the first exemplary embodiment. In step S801, the image sensor 506 preforms exposure on each unit pixel 101. In step S802, the image sensor 506 starts reading the A and B image signals from each unit pixel 101. In step S803, simultaneously with the start of reading, the image sensor 506 generates a trigger for starting the imaging plane phase difference AF calculation processing. In step S804, the image sensor 506 generates a trigger for starting the contrast AF calculation processing. In step S805, the image sensor 506 stores the captured image data in the frame memory 117.

FIG. 8B is a flowchart illustrating the simplified phase difference AF calculation processing according to the first exemplary embodiment. Upon reception of the trigger generated in step S803 illustrated in FIG. 8A, the image sensor 506 starts processing. In step S806, the image sensor 506 performs the simplified phase difference AF calculation. In step S807, the image sensor 506 stores the result of the simplified phase difference AF calculation in the frame memory 117. In step S808, the image sensor 506 determines the reliability of the result of the simplified phase difference AF calculation. When the image sensor 506 determines that the reliability is low (NO in step S808), the processing proceeds to step S809. In step S809, the image sensor 506 reads the A and B image signals from the frame memory 117.

In step S810, the image sensor 506 performs the detailed phase difference AF calculation processing. In step S811, the image sensor 506 stores the result of the calculation in the frame memory 117. In step S812, the image sensor 506 transmits the result to the outside. On the other hand, when the image sensor 506 determines that the reliability of the result of the simplified phase difference AF calculation is high (YES in step S808), the processing proceeds to step S812. In this case, the image sensor 506 does not perform the detailed phase difference AF calculation processing. In step S812, the image sensor 506 transmits the result of the simplified phase difference AF calculation to the outside.

FIG. 8C is a flowchart illustrating the contrast AF calculation processing according to the first exemplary embodiment. Upon reception of the trigger generated in step S804 illustrated in FIG. 8A, the image sensor 506 starts processing. In step S813, the image sensor 506 performs addition processing on the A and B image signals to generate an (A+B) image signal. In step S814, the image sensor 506 performs the contrast AF calculation processing by using the (A+B) image signal. In step S815, the image sensor 506 stores the result of the contrast AF calculation in the frame memory 117. In step S812, the image sensor 506 transmits the result of the contrast AF calculation (third focus detection data) to the outside.

Referring to FIGS. 8A to 8C, in step S812, the results of the AF calculations (the result of the simplified phase difference AF calculation, the result of the detailed phase difference AF calculation, and the result of the contrast AF calculation) stored in the frame memory 117 are transmitted out of the image sensor 506 together with the captured image data.

Figure 9:
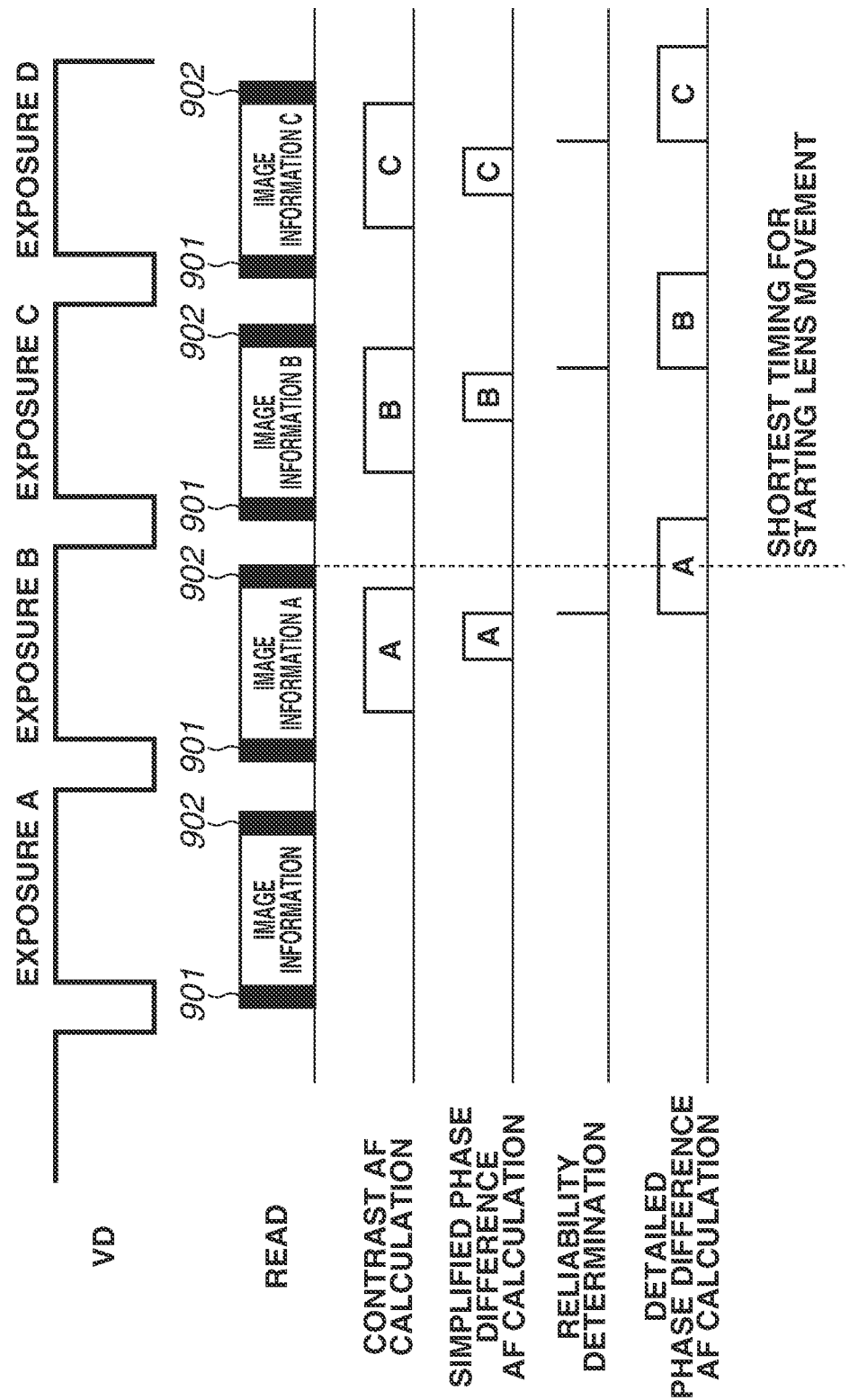
FIG. 9 is a timing chart illustrating imaging processing according to a first exemplary embodiment.

FIG. 9 is a timing chart illustrating the imaging processing according to the first exemplary embodiment. The image sensor 506 performs exposure A for the first frame A. While the image sensor 506 is performing exposure B for the following frame B, the image sensor 506 reads captured image data A obtained by exposure A. In parallel with reading of the captured image data A, the image sensor 506 performs the contrast AF calculation processing and the simplified phase difference AF calculation processing by using the image signal obtained in the frame A. As described in FIG. 8B, when the image sensor 506 determines that the reliability of the result of the simplified phase difference AF calculation is low, the image sensor 506 performs the detailed phase difference AF calculation processing.

FIG. 10 schematically illustrates the configuration of captured image data output from the image sensor 506. As illustrated in FIG. 10, the image sensor 506 adds the result of the detailed phase difference AF calculation (a calculation result 902 illustrated in FIG. 9) for the preceding frame to the top (forward) of the captured image data for the current frame. The image sensor 506 further adds the result of the simplified phase difference AF calculation and the result of the contrast AF calculation (a calculation result 901 illustrated in FIG. 9) for the current frame to the end (backward) of the captured image data.

More specifically, the image sensor 506 adds the results of the AF calculations to the top and end of the captured image data and outputs the results out of the image sensor 506. The result of the simplified phase difference AF calculation and the result of the detailed phase difference AF calculation are the above-described defocus amounts calculated by the formula (2), and the result of the contrast AF calculation is the above-described SAD value.

When the image sensor 506 determines that the reliability of the simplified phase difference AF calculation is high, the total control calculation unit 509 performs focus control based on the result of the simplified phase difference AF calculation or on the results of the simplified phase difference AF calculation and the contrast AF calculation added to the end of the captured image data. More specifically, the total control calculation unit 509 instructs the lens drive unit 502 to move the lens 501. On the other hand, when the image sensor 506 determines that the reliability of the simplified phase difference AF calculation is low, the total control calculation unit 509 performs focus control based on the result of the detailed phase difference AF calculation or on the results of the detailed phase difference AF calculation and the contrast AF calculation added to the top of the captured image data for the following frame. More specifically, the total control calculation unit 509 instructs the lens drive unit 502 to move the lens 501.

Figure 11:
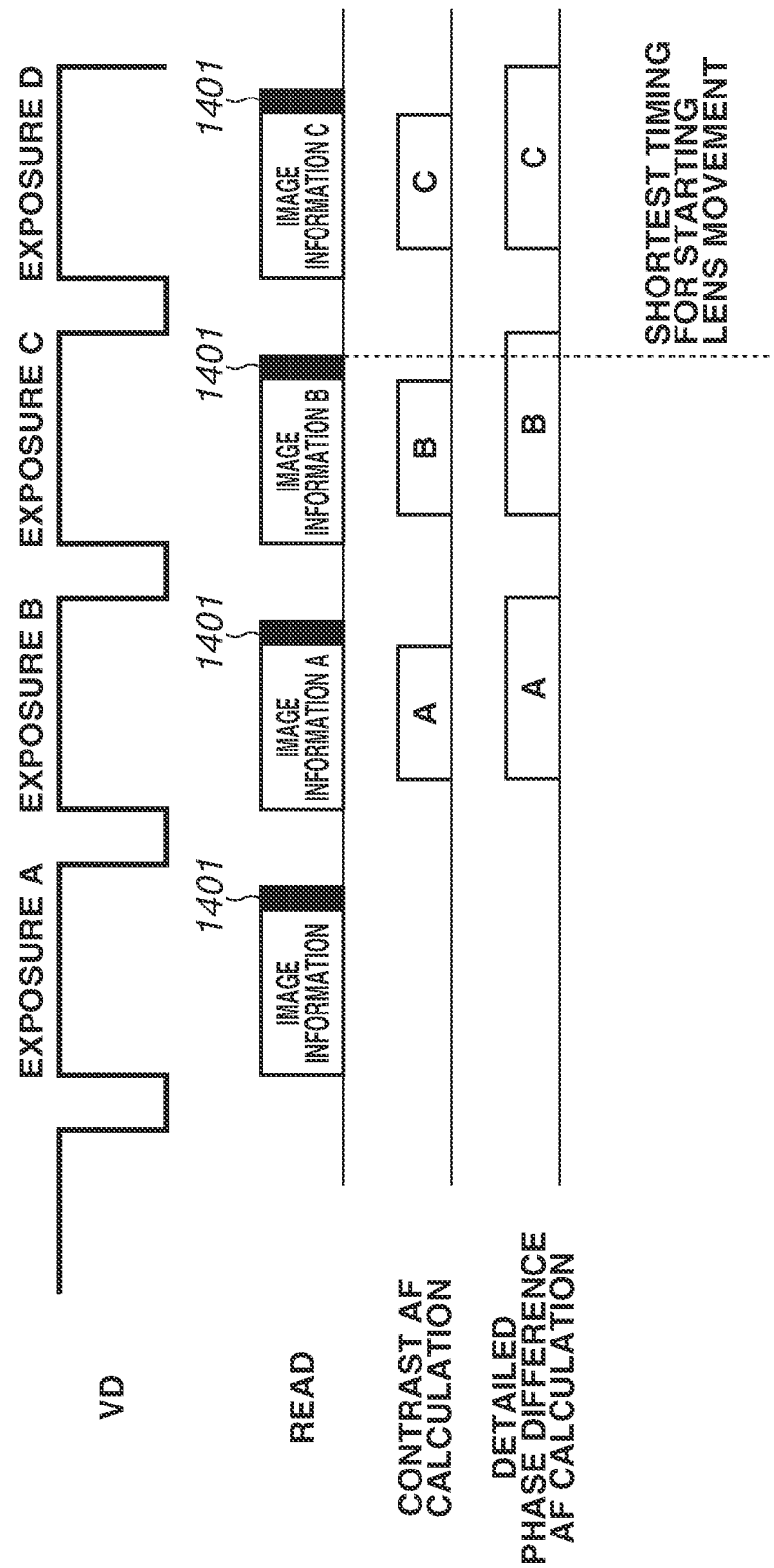
FIG. 11 is a timing chart illustrating imaging processing according to a comparative example.

For comparison, a case where the simplified phase difference AF calculation processing is not performed will be described below with reference to FIG. 11. The image sensor 506 performs exposure A for the first frame A. While the image sensor 506 is performing exposure B for the following frame B, the image sensor 506 reads captured image data A obtained by exposure A. In parallel with reading of the captured image data A, the image sensor 506 performs the contrast AF calculation processing and the detailed phase difference AF calculation processing by using the image signal obtained in the frame A.

Since the imaging plane phase difference AF calculation processing using the image signal obtained in the frame A does not end before completion of reading of the captured image data A, the image sensor 506 adds a calculation result 1401 to the end of the captured image data B obtained in the following frame B and outputs the captured image data B. The timing of reading the captured image data B exists in exposure C for the following frame C. Therefore, there arises a remarkable time delay until the focus lens starts moving, resulting in a time lag between exposure and lens focus control.

In a case where the simplified phase difference AF calculation is not performed in this way, performing the imaging processing as described above with reference to FIG. 9 enables starting focus control by using the result of the simplified phase difference AF calculation obtained in the same frame output together with the captured image data.

FIG. 12 illustrates examples of set AF frames to be used for the simplified phase difference AF calculation and the detailed phase difference AF calculation according to the first exemplary embodiment. The number of AF frames to be used for the simplified phase difference AF calculation is set to be smaller than the number of AF frames to be used for the detailed phase difference AF calculation. This setting is intended to shorten the calculation time to complete the simplified phase difference AF calculation processing before completion of the output of the captured image data.

The number of unit pixels to be used for the simplified phase difference AF calculation processing can be reduced according to the number and positions of set AF selection frames. Reducing the number of unit pixels to be used for the simplified phase difference AF calculation processing enables shortening the calculation processing time.

The detailed phase difference AF calculation processing is to be completed before the output of the captured image data for the following frame is started. A blanking period (a time period during which the captured image data is not transferred to the imaging signal processing circuit 507) exists until the output of the captured image data for the following frame is started. Therefore, the image sensor 506 determines the number of unit pixels to be used for the detailed phase difference AF calculation processing, according to the number and positions of AF selection frames and the blanking period. The existence of the blanking period makes it possible to set a larger number of unit pixels to be used for the detailed phase difference AF calculation processing than the number of unit pixels to be used for the simplified phase difference AF calculation processing.

In both the simplified phase difference AF calculation processing and the detailed phase difference AF calculation processing, measuring the calculation speed per unit pixel in advance enables determining the number of unit pixels usable for each AF calculation. When the subject is dark, multiplying the image signal by the gain enables obtaining a more reliable calculation result. Further, the image sensor 506 can automatically select a reliable AF selection frame based on the reliability of the result of each phase difference AF calculation.

The above-described configuration makes it possible to shorten the time lag between exposure and lens focus control even in a case where the time of the phase difference AF calculation processing is prolonged with increasing the number of unit pixels to be used for the imaging plane phase difference AF calculation. Determining the reliability of each phase difference AF calculation also enables ensuring the accuracy and reliability of the imaging plane phase difference AF calculation.

Although, in the first exemplary embodiment, an image sensor in which all unit pixels are pupil-divided as illustrated in FIG. 5 is used, the configuration is not limited thereto, i.e., not all unit pixels are to be pupil-divided. For example, only a part of unit pixels may be pupil-divided.

According to the first exemplary embodiment, the image sensor 506 adds the result of the detailed phase difference AF calculation for the preceding frame to the top of the captured image data, and adds the results of the simplified phase difference AF calculation and the contrast AF calculation for the current frame to the end of the captured image data. On the other hand, a second exemplary embodiment will be described below based on a case where the image sensor 506 adds the results of the simplified phase difference AF calculation and the contrast AF calculation for the preceding frame to the top of the captured image data, and adds the result of the detailed phase difference AF calculation for the preceding frame to the end of the captured image data. The configurations of the imaging apparatus and image sensor according to the second exemplary embodiment are similar to those according to the first exemplary embodiment, and descriptions thereof will be omitted.

Figure 13:
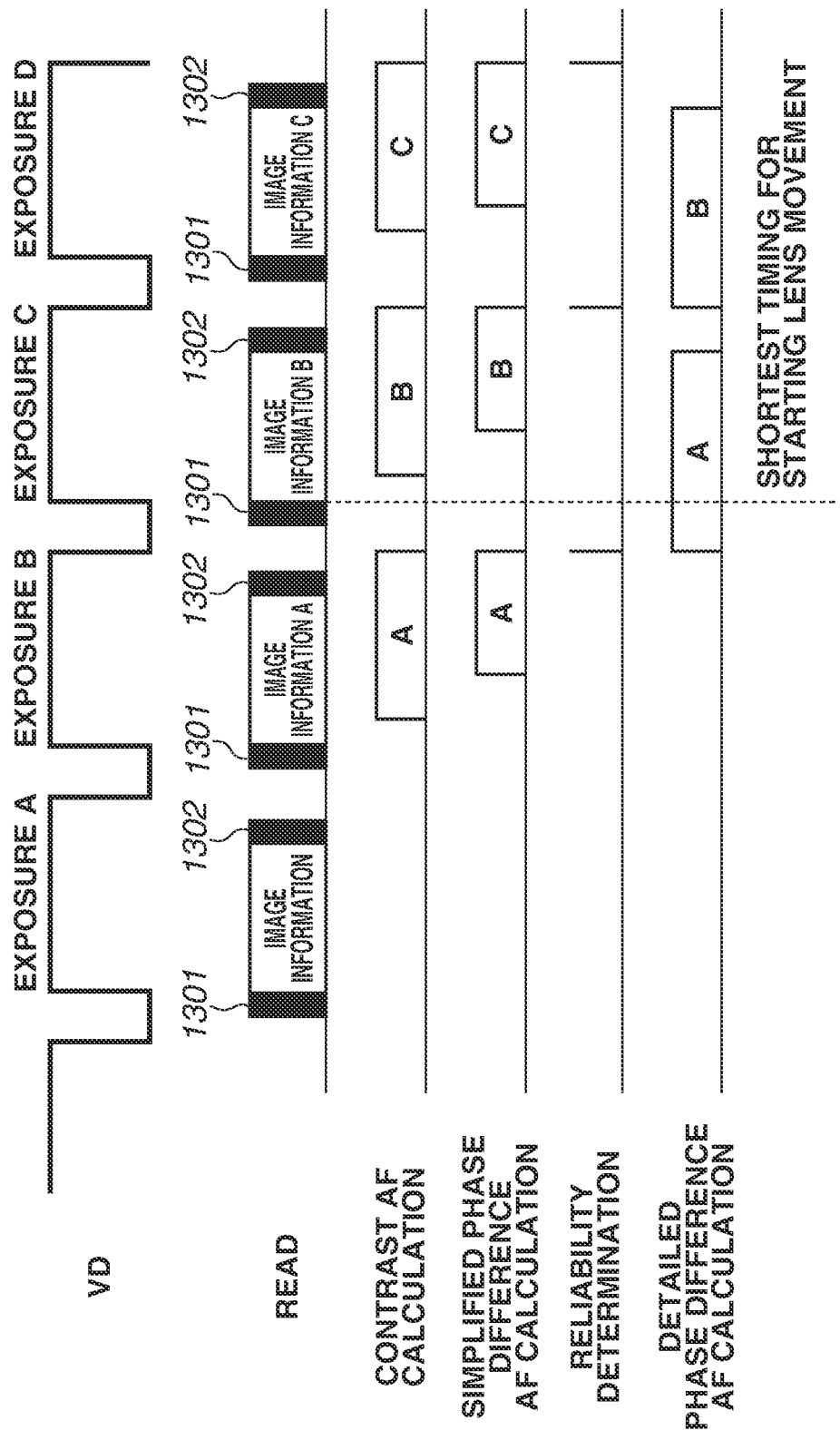
FIG. 13 is a timing chart illustrating imaging processing according to a second exemplary embodiment.

FIG. 13 is a timing chart illustrating imaging processing according to the second exemplary embodiment. The image sensor 506 performs exposure A for the first frame A. While the image sensor 506 is performing exposure B for the following frame B, the image sensor 506 reads captured image data A obtained by exposure A. In parallel with reading of the captured image data A, the image sensor 506 performs the contrast AF calculation processing and the simplified phase difference AF calculation processing by using the image signal obtained in the frame A. As described in FIG. 8B, when the image sensor 506 determines that the reliability of the result of the simplified phase difference AF calculation is low, the image sensor 506 performs the detailed phase difference AF calculation processing.

FIG. 14 schematically illustrates the data configuration of the captured image data output from the image sensor 506 according to the second exemplary embodiment. As illustrated in FIG. 14, the image sensor 506 adds the results of the simplified phase difference AF calculation and the contrast AF calculation (a calculation result 1301 illustrated in FIG. 13) for the preceding frame to the top (forward) of the captured image data for the current frame. The image sensor 506 further adds the result of the detailed phase difference AF calculation (a calculation result 1302 illustrated in FIG. 13) for the preceding frame to the end (backward) of the captured image data for the current frame. Then, the image sensor 506 outputs the result of each AF calculation.

When the image sensor 506 determines that the reliability of the simplified phase difference AF calculation is high, the total control calculation unit 509 performs focus control based on the result of the simplified phase difference AF calculation or on the results of the simplified phase difference AF calculation and the contrast AF calculation for the preceding frame added to the top of the captured image data. More specifically, the total control calculation unit 509 instructs the lens drive unit 502 to move the lens 501.

On the other hand, when the image sensor 506 determines that the reliability of the simplified phase difference AF calculation is low, the total control calculation unit 509 performs focus control based on the result of the detailed phase difference AF calculation or on the results of the detailed phase difference AF calculation and the contrast AF calculation for the preceding frame added to the end of the captured image data. More specifically, the total control calculation unit 509 instructs the lens drive unit 502 to move the lens 501.

Although, in the above-described configuration, the time lag between exposure and lens focus control is longer than that according to the first exemplary embodiment, the present exemplary embodiment is effective for improving the reliability of the simplified phase difference AF calculation or reducing the power consumption of circuits by each AF calculation. When reducing the power consumption of circuits, for example, a unit for decreasing the clock frequency of each AF calculation processing unit can be used.

The simplified phase difference AF calculation processing and the contrast AF calculation processing are to be completed before the output of the captured image data for the following frame is started. A blanking period (a time period during which the captured image data is not transferred to the imaging signal processing circuit 507) exists until the output of the captured image data for the following frame is started. Therefore, the image sensor 506 determines the number of unit pixels to be used for the simplified phase difference AF calculation processing according to the number of AF selection frames and the blanking period.

The simplified phase difference AF calculation processing is to be completed before the output of the captured image data for the following frame is started. A blanking period (a time period during which the captured image data is not transferred to the imaging signal processing circuit 507) and a time period for reading the captured image data for the current frame exist until the output of the captured image data for the following frame is started. Therefore, the image sensor 506 determines the number of unit pixels to be used for the detailed phase difference AF calculation processing according to the number of AF selection frames, the blanking period, and the time period for reading the captured image data for the current frame.

The existence of the blanking period and the time period for reading the captured image data for the current frame makes it possible to set a larger number of unit pixels to be used for the detailed phase difference AF calculation processing than the number of unit pixels to be used for the simplified phase difference AF calculation processing.

In both the simplified phase difference AF calculation processing and the detailed phase difference AF calculation processing, measuring the calculation speed per unit pixel in advance enables determining the number of unit pixels usable for each AF calculation. When the subject is dark, multiplying the image signal by the gain enables obtaining a more reliable calculation result.

According to the present exemplary embodiment, the result of the contrast AF calculation for the preceding frame has been added to the top of the captured image data for the current frame. The processing is not limited thereto. In a case where the contrast AF calculation processing takes time, for example, not only the result of the detailed phase difference AF calculation but also the result of the contrast AF calculation for the preceding frame may be added to the end of the captured image data for the current frame.

The above-described configuration makes it possible to shorten the time lag between exposure and lens focus control even in a case where the clock frequency of each AF calculation processing unit is decreased to reduce the power consumption of circuits. Determining the reliability of each phase difference AF calculation also enables ensuring the accuracy and reliability of the imaging plane phase difference AF calculation.

Although, also in second exemplary embodiment, an image sensor in which all unit pixels are pupil-divided as illustrated in FIG. 5 is used, the configuration is not limited thereto, i.e., not all the unit pixels are to be pupil-divided. For example, only a part of unit pixels may be pupil-divided.

While the disclosure has specifically been described based on the above-described exemplary embodiments, the disclosure is not limited thereto but can be modified in diverse ways within the ambit of the appended claims.

Other Exemplary Embodiments

The aspect of the embodiments is implemented also by performing the following processing. More specifically, software (program) for implementing the functions of the above-described exemplary embodiments is supplied to a system or an apparatus via a network or various types of storage media, and a computer (or central processing unit (CPU) or micro processing unit (MPU)) of the system or the apparatus reads and executes the program.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An image sensor comprising:
a pixel unit in which a plurality of unit pixels for converting an optically formed subject image into an image signal is arranged in a matrix form;
at least one processor; and
a memory coupled to the at least one processor, the memory having instructions that, when executed by the processor, performs operations as:
a first focus detector that performs first focus detection by detecting a phase difference based on a first image signal to generate first focus detection data;
a second focus detector that performs second focus detection by detecting a phase difference based on a second image signal to generate second focus detection data; and
an output unit that adds both of the first and the second focus detection data to captured image data based on the image signal, and outputs the captured image data.

2. The image sensor according to claim 1, wherein the second focus detector performs more detailed phase difference detection than phase difference detection by the first focus detector to generate second focus detection data.

3. The image sensor according to claim 2, wherein the processor further performs operations as a determination unit that determines a reliability of the first focus detection data, wherein, in a case that the reliability of the first focus detection data is low, the second focus detector performs the more detailed phase difference detection.

4. The image sensor according to claim 1, wherein the plurality of unit pixels includes pupil-divided unit pixels.

5. The image sensor according to claim 4, wherein the first and the second focus detectors detect the phase difference based on image signals output from the pupil-divided unit pixels.

6. The image sensor according to claim 1, wherein the number of unit pixels to be used in the first focus detection performed by the first focus detector is smaller than the number of unit pixels to be used in the second focus detection performed by the second focus detector.

7. The image sensor according to claim 1, wherein, in a case where the second focus detector performs the second focus detection based on signals output from all unit pixels, the first focus detector does not perform the first focus detection.

8. The image sensor according to claim 1, wherein the output unit adds the first and the second focus detection data to the top of and an end of the captured image data, and outputs the captured image data.

9. The image sensor according to claim 8, wherein the output unit adds the first focus detection data to the top of the captured image data, adds the second focus detection data to an end of the captured image data, and outputs the captured image data.

10. The image sensor according to claim 8, wherein the output unit adds the second focus detection data to the top of the captured image data, adds the first focus detection data to an end of the captured image data, and outputs the captured image data.

11. The image sensor according to claim 1, wherein the processor further performs operations as a third focus detector that performs focus detection by detecting a contrast of a subject to generate third focus detection data.

12. The image sensor according to claim 11, wherein the output unit adds the third focus detection data to the top of the captured image data, and outputs the captured image data.

13. The image sensor according to claim 11, wherein the output unit adds the third focus detection data to the end of the captured image data, and outputs the captured image data.

14. The image sensor according to claim 1, wherein a plurality of semiconductor chips is stacked on top of each other.

15. An imaging device comprising:
an image sensor; and
a control unit configured to control a drive of the image sensor,
wherein the image sensor including:
a pixel unit in which a plurality of unit pixels for converting an optically formed subject image into an image signal is arranged in a matrix form;
at least one processor; and
a memory coupled to the at least one processor, the memory having instructions that, when executed by the processor, performs operations as:
a first focus detector that performs first focus detection by detecting a phase difference based on a first image signal to generate first focus detection data;
a second focus detector that performs second focus detection by detecting a phase difference based on a second image signal to generate second focus detection data; and
an output unit that adds both of the first and the second focus detection data to captured image data based on the image signal, and outputs the captured image data.

16. The imaging device according to claim 15, wherein the second focus detector performs more detailed phase difference detection than phase difference detection by the first focus detector to generate second focus detection data.

17. The imaging device according to claim 16, wherein the processor further performs operations as a determination unit that determines a reliability of the first focus detection data, wherein, in a case that the reliability of the first focus detection data is low, the second focus detector performs the more detailed phase difference detection.

18. The imaging device according to claim 15, wherein the plurality of unit pixels includes pupil-divided unit pixels.

19. The imaging device according to claim 18, wherein the first and the second focus detectors detect the phase difference based on image signals output from the pupil-divided unit pixels.

20. The imaging device according to claim 15, wherein the number of unit pixels to be used in the first focus detection performed by the first focus detector is smaller than the number of unit pixels to be used in the second focus detection performed by the second focus detector.

21. The imaging device according to claim 15, wherein, in a case where the second focus detector performs the second focus detection based on image signals output from all unit pixels, the first focus detector does not perform the first focus detection, and outputs the captured image data.

22. The imaging device according to claim 15, wherein the output unit adds the first and the second focus detection data to the top of and an end of the captured image data, and outputs the captured image data.

23. The imaging device according to claim 22, wherein the output unit adds the first focus detection data to the top of the captured image data, adds the second focus detection data to an end of the captured image data, and outputs the captured image data.

24. The imaging device according to claim 22, wherein the output unit adds the second focus detection data to the top of the captured image data, adds the first focus detection data to an end of the captured image data, and outputs the captured image data.

25. The imaging device according to claim 15, wherein the processor further performs operations as a third focus detector that performs focus detection by detecting a contrast of a subject to generate third focus detection data.

26. The imaging device according to claim 25, wherein the output unit adds the third focus detection data to the top of the captured image data, and outputs the captured image data.

27. The imaging device according to claim 25, wherein the output unit adds the third focus detection data to the end of the captured image data, and outputs the captured image data.

28. The imaging device according to claim 15, wherein a plurality of semiconductor chips is stacked on top of each other.

\* \* \* \* \*